US009252073B2

United States Patent
Yamashita et al.

(10) Patent No.: US 9,252,073 B2
(45) Date of Patent: Feb. 2, 2016

(54) HEAT SINK AND HEAT SINK FAN (71) Applicant: Nidec Corporation, Kyoto (JP)

(72) Inventors: Takamasa Yamashita, Kyoto (JP); Nobuya Nakae, Kyoto (JP)

(73) Assignee: NIDEC CORPORATION, Kyoto (JP)

( * ) Notice: Subject to any disclaimer, the term of this patent is extended or adjusted under 35 U.S.C. 154(b) by 449 days.

(21) Appl. No.: 13/783,469

(22) Filed: Mar. 4, 2013

(65) Prior Publication Data
US 2014/0138067 A1 May 22, 2014

(30) Foreign Application Priority Data

Nov. 19, 2012 (JP) ................................. 2012-252871

(51) Int. Cl.
F28F 7/00 (2006.01)
F28D 15/00 (2006.01)
F24H 3/02 (2006.01)
H01L 23/467 (2006.01)
H01L 23/367 (2006.01)

(52) U.S. Cl.
CPC .......... H01L 23/467 (2013.01); H01L 23/3672 (2013.01); *H01L 2924/0002* (2013.01)

(58) Field of Classification Search
CPC ............... H01L 23/467; H01L 23/3672; F28F 2215/04; F28F 2215/10; F28D 2021/0029
USPC .................... D13/179; 165/121, 80.3, 104.34
See application file for complete search history.

(56) References Cited

U.S. PATENT DOCUMENTS

| 6,714,415 | B1 * | 3/2004 | Shah ...................... H01L 23/467 165/185 |
| 6,779,593 | B1 * | 8/2004 | Hegde ........................... 165/80.3 |
| 6,937,473 | B2 * | 8/2005 | Cheng et al. ................... 361/704 |
| 7,269,013 | B2 * | 9/2007 | Chen et al. ..................... 361/700 |
| D593,042 | S * | 5/2009 | Yamashita et al. ............ D13/179 |
| 7,532,472 | B2 * | 5/2009 | Lin ..................... H01L 23/4006 165/104.33 |
| 7,583,503 | B2 * | 9/2009 | Lin .......................... H01L 23/40 165/80.3 |
| 7,623,348 | B2 * | 11/2009 | Otsuki et al. .................. 361/697 |

(Continued)

FOREIGN PATENT DOCUMENTS

| JP | 2004-336031 A | 11/2004 |
| JP | 2008-091644 A | 4/2008 |

(Continued)

*Primary Examiner* — Frantz Jules
*Assistant Examiner* — Claire Rojohn, III
(74) *Attorney, Agent, or Firm* — Keating & Bennett, LLP (57) ABSTRACT Each fin of a heat sink includes a main fin connected to a core and extending radially outwards, and a pair of branch fins extending radially outwards from a branch point at a radially outer end of the main fin. Among a plurality of fins, in each of three fins which are adjacent in the circumferential direction, a width of an end portion of the main fin viewed along the center axis expands radially outwards at an angle which is larger than an expanding angle of the pair of branch fins. A difference between a distance from the center axis to the branch point in the center one of the fins and a distance from the center axis to the branch point in each of the other two fins is equal to or larger than a width of a root of the main fin in the center radiating fin.

11 Claims, 6 Drawing Sheets

(56) References Cited

U.S. PATENT DOCUMENTS

| | | | |
|---|---|---|---|
| D615,503 S * | 5/2010 | Otsuki et al. | D13/179 |
| D662,899 S * | 7/2012 | Shum et al. | D13/179 |
| 8,256,258 B2 * | 9/2012 | Yamaoka | B21C 23/08 29/890.03 |
| 8,430,152 B2 * | 4/2013 | Liu | H01L 23/4006 165/68 |
| 2005/0056399 A1 * | 3/2005 | Ku | H01L 23/467 165/80.3 |
| 2006/0213642 A1 * | 9/2006 | Lai | F28F 1/12 165/80.3 |
| 2007/0159798 A1 * | 7/2007 | Chen | H01L 23/4006 361/700 |
| 2008/0080137 A1 | 4/2008 | Otsuki et al. | |
| 2008/0142194 A1 * | 6/2008 | Zhou et al. | 165/80.3 |
| 2008/0180912 A1 | 7/2008 | Yamaoka et al. | |
| 2008/0223551 A1 * | 9/2008 | Otsuki | H01L 23/467 165/80.3 |
| 2009/0073656 A1 * | 3/2009 | Otsuki | H01L 23/367 361/697 |
| 2009/0218079 A1 * | 9/2009 | Watanabe et al. | 165/121 |
| 2010/0132918 A1 * | 6/2010 | Lin | H01L 23/467 165/80.3 |
| 2010/0243219 A1 * | 9/2010 | Yang | H01L 23/4006 165/122 |
| 2011/0132573 A1 * | 6/2011 | Liu | H01L 23/4006 165/68 |
| 2014/0138067 A1 * | 5/2014 | Yamashita | H01L 23/3672 165/121 |

FOREIGN PATENT DOCUMENTS

| | | |
|---|---|---|
| JP | 2008-198967 A | 8/2008 |
| JP | 2009-206404 A | 9/2009 |

* cited by examiner

HEAT SINK AND HEAT SINK FAN

BACKGROUND OF THE INVENTION

1. Field of the Invention

The present invention relates to a heat sink and a heat sink fan.

2. Description of the Related Art

Conventionally, a heat sink fan is utilized as a cooling device which cools a CPU mounted in a computer. The heat sink fan is a combination of a heat sink of metal to which the heat from the CPU is transmitted with a fan. The heat sink includes a plurality of fins arranged in a circumferential direction. The heat transmitted from the CPU to the heat sink is efficiently radiated by the air sent by the fan to the heat sink.

Japanese Laid-Open Patent Publication No. 2009-206404 and Japanese Laid-Open Patent Publication No. 2004-336031 disclose a radiating fin which branches into two portions on a radially outer side. Japanese Laid-Open Patent Publication No. 2008-91644 discloses a radiating fin which branches into three branch fins on the radially outer side.

In a heat sink in which each radiating fin branches into two branch fins on the radially outer side, the branch points of all of the fins are arranged on the inner side, so as to increase the surface area. This arrangement may increase the radiating efficiency of the heat sink. However, in such a heat sink, a width of a gap between branch fins in the radiating fin or a width of a gap between fins is narrow. If the width of respective gap is excessively narrow, the flow of air from the fan is blocked. Thus, it is impossible to increase the radiating efficiency of the heat sink.

SUMMARY OF THE INVENTION

A heat sink according to one exemplary preferred embodiment of the present invention includes a plurality of fins arranged radially about a center axis to be spaced away from one another, the fins extending outward in a radial direction perpendicular or substantially perpendicular to the center axis; and a core arranged to couple and to support the inner sides of the plurality of fins, wherein each of the plurality of fins includes a main fin connected to the core and extending radially outwards; and a pair of branch fins which are branched in a circumferential direction from a branch point as a radially outer end of the main fin, and which extend radially outwards, among the plurality of fins, in each of three fins which are adjacent in the circumferential direction, a width of an end portion including the end of the main fin viewed along the center axis expands radially outwards at an angle which is larger than an expanding angle of the pair of branch fins, and among the three fins, a difference between a distance from the center axis to the branch point in the center one of the fins and a distance from the center axis to the branch point in each of the other two fins is equal to or larger than a width of a root of the main fin in the center one of the fins.

According to the heat sink according to the one exemplary preferred embodiment of the present invention, the radiating efficiency of the heat sink can be increased while the width of a gap between branch fins in the radiating fin, and the width of a gap between fins are prevented from being narrowed excessively.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Referring to FIGS. 1 through 6, preferred embodiments of the present invention will be described in detail. It should be noted that in the explanation of preferred embodiments of the present invention, the upper side in the direction along the center axis of the heat sink fan is simply referred to as "the upper side", and the lower side is simply referred to as "the lower side". It should be noted that the up/down directions do not necessarily indicate the positional relationships and orientations when it is assembled into an actual device. Meanwhile, in the following description, a direction parallel or substantially parallel to the center axis is referred to as an "axial direction", a radial direction with the center axis as the center is simply referred to as a "radial direction", and a circumferential direction with the center axis as the center is simply referred to as a "circumferential direction".

Figure 1:
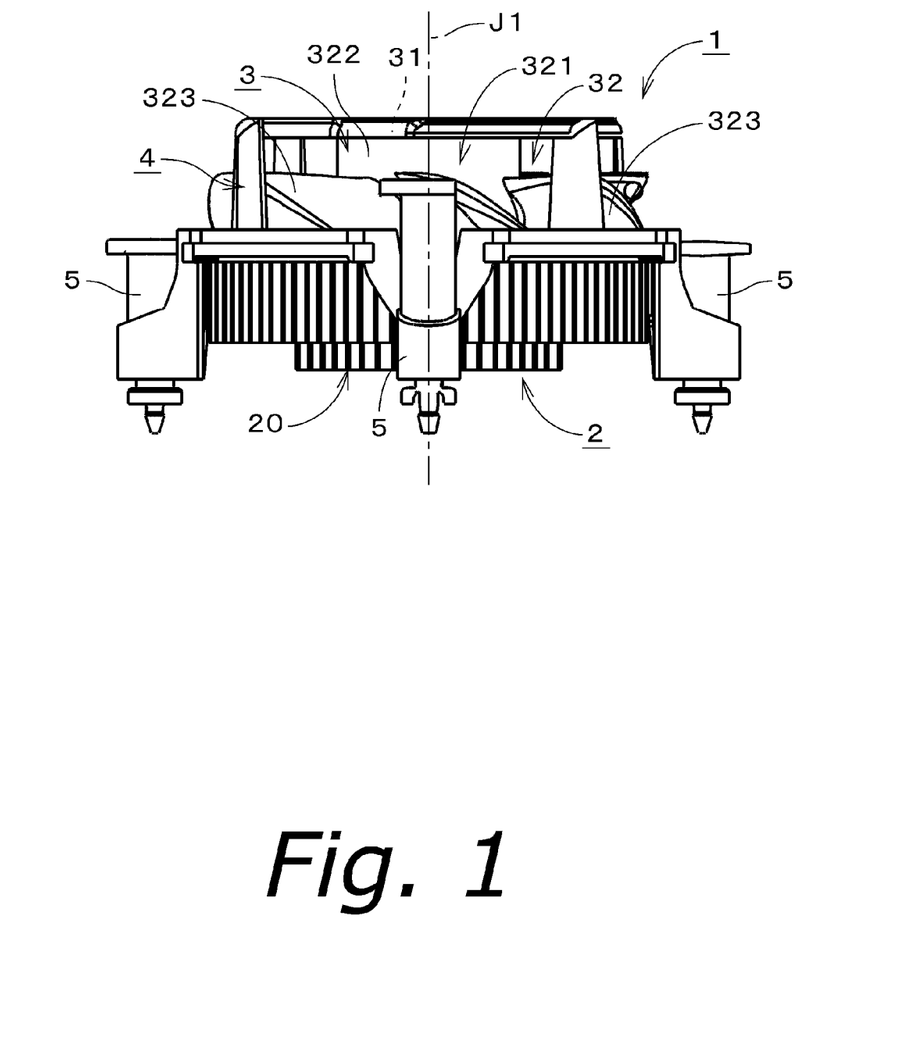
FIG. 1 is a front view of a heat sink fan according to a preferred embodiment of the present invention.

FIG. 1 is a front view showing a heat sink fan 1 according to one exemplary preferred embodiment of the present invention. The heat sink fan 1 is a cooling device attached to a heat source such as, for example, a CPU (Central Processing Unit) in the interior of a computer or the like, and arranged to cool the heat source by radiating the heat transmitted from the heat source by using a heat sink 2.

The heat sink fan 1 preferably includes the heat sink 2, a fan 3, a mounting portion 4, and a plurality of fixing pins 5. A lower surface of the heat sink 2 is in contact with a heat source such that heat is transmitted from the heat source to the heat sink 2. The fan 3 is an axial fan, and is arranged on the upper side of the heat sink 2. The fan 3 sends the air to the heat sink 2, so as to cool the heat sink 2. The mounting portion 4 fixes the fan 3 to the heat sink 2. The plurality of fixing pins 5 are utilized to mount the heat sink fan 1. The center axes of the heat sink 2 and the fan 3 correspond with or substantially correspond with the center axis J1 of the heat sink fan 1.

The fan 3 includes a stationary portion 31 and a rotating portion 32. The stationary portion 31 is fixed to the heat sink 2 via the mounting portion 4. The rotating portion 32 is arranged on the lower side of the stationary portion 31, and is supported in a rotatable manner with respect to the stationary portion 31 by a bearing mechanism. The rotating portion 32 includes an impeller 321 made of, for example, a resin material. The impeller 321 preferably includes a cup 322 and a plurality of blades 323. The cup 322 has a cylindrical or substantially cylindrical shape with a bottom with the center axis J1 as its center. The plurality of blades 323 are fixed to an outer circumferential surface of the cup 322 and extend radially from the outer circumferential surface. The cup 322 is preferably defined by a single monolithic member together with the plurality of blades 323. The above-described bearing mechanism, a stator of the stationary portion 31, and a rotor magnet of the rotating portion 32 are preferably arranged on the inside of the cup 322. When the fan 3 is driven, the impeller 321 is caused to rotate so as to send air to the heat sink 2.

Figure 2:
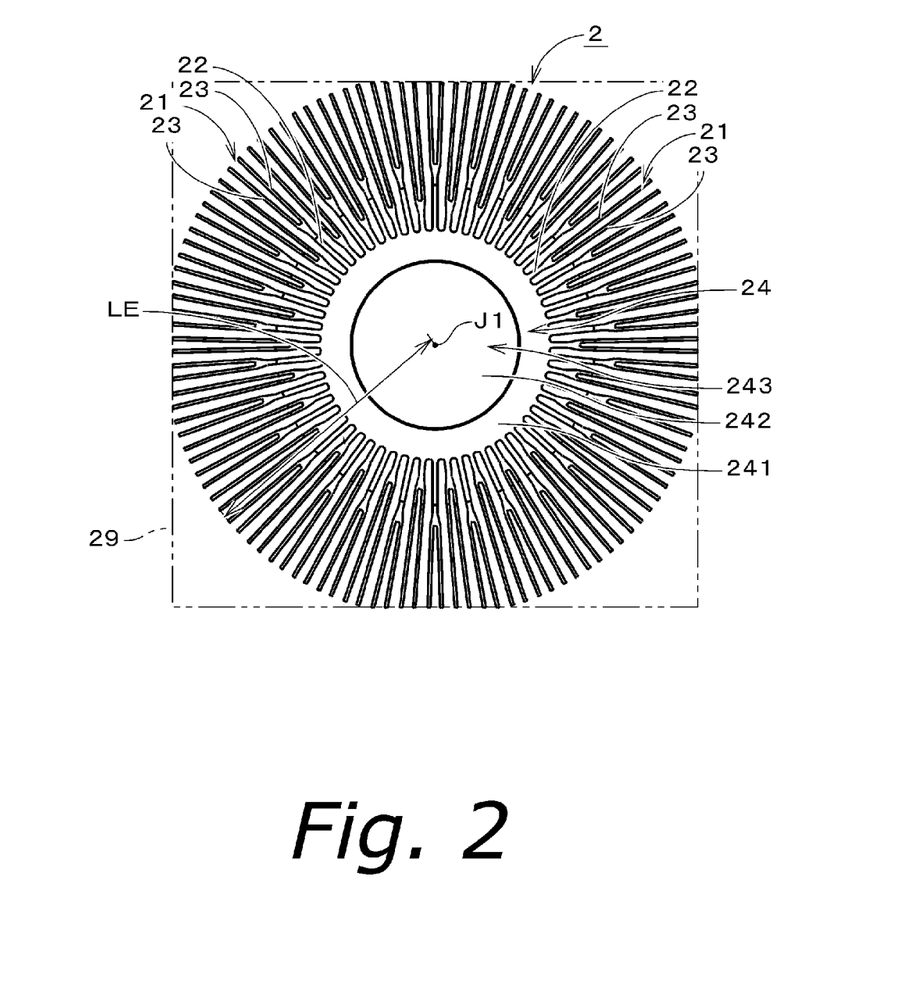
FIG. 2 is a bottom view showing a heat sink according to a preferred embodiment of the present invention.

FIG. 2 is a bottom view of the heat sink 2. The heat sink 2 preferably includes a plurality of fins 21 and a columnar core 24. The plurality of fins 21 are arranged at regular or substantially regular intervals in the circumferential direction with the center axis J1 as the center. That is, the plurality of fins 21 are arranged radially with the center axis J1 as the center to be spaced away from one another. The plurality of fins 21 extending outward in the radial direction perpendicular or substantially perpendicular to the center axis J1. As described above, the center axis J1 extends along the up/down directions of the heat sink fan 1 shown in FIG. 1. Each respective fin 21 preferably has a shape of a thin plate expanding in the radial direction and the up/down directions.

The core 24 preferably includes a cylindrical portion 241 as an outer edge portion, and a center portion 242. The cylindrical portion 241 couples and supports the inner sides of the plurality of fins 21. An outer circumferential surface of the center portion 242 is a cylindrical surface with the center axis J1 as the center. The center portion 242 is inserted into and fixed to the cylindrical portion 241. For example, the center portion 242 is preferably fixed in the cylindrical portion 242 by, for example, shrink fitting. A lower surface 243 of the center portion 242 is preferably positioned slightly below a lower surface of the cylindrical portion 241. The lower surface 243 of the center portion 242 is preferably a smooth surface perpendicular or substantially perpendicular to the center axis J1. The lower surface 243 comes into contact with the heat source such as a CPU. The center portion 242 contains a copper alloy. The cylindrical portion 241 and the plurality of (all of) the fins 21 contain an aluminum (al) alloy.

The cylindrical portion 241 and the plurality of fins 21 are preferably provided as a single monolithic member formed by, for example, extrusion molding which utilizes a heat sink fabricating die. In the extrusion molding, a columnar billet of an aluminum alloy is first prepared. The billet is heated up to a predetermined temperature so as to be softened. Then, the billet is intruded in a dividing die. As a result, the columnar billet is divided at regular angular intervals in the circumferential direction with the center axis as the center so as to obtain a plurality of divided materials. At this time, by the dividing die, a columnar portion of the billet in the vicinity of the center axis is separated. Accordingly, the collection of the plurality of divided materials is cylindrical. The plurality of divided materials are intruded in the heat sink fabricating die. As a result, from each divided material, a portion of the cylindrical portion 241 and some of the fins 21 (two or more fins 21 adjacent in the circumferential direction) are provided.

The plurality of divided materials after passing through the heat sink fabricating die mutually come into contact with each other, so as to be joined together. Accordingly, the cylindrical portion 241 and the plurality of fins 21 are provided as a single monolithic member. Actually, the billet is preferably sequentially and continuously intruded in the dividing die and the heat sink fabricating die. The cylindrical portion 241 and the plurality of fins 21 may alternatively be formed by pultrusion molding which utilizes the dividing die and the heat sink fabricating die. The center portion 242 may be provided as a single monolithic member together with the cylindrical portion 241 and the plurality of fins 21. In this case, the center portion 242 is also preferably made of an aluminum alloy, for example. It should be noted that the center portion 242 of aluminum alloy may be separately fabricated, and be fixed in the cylindrical portion 241 of aluminum alloy if so desired.

The respective radiating fins 21 preferably include a main fin 22 and a pair of branch fins 23. The main fin 22 is connected to the core 24 and extends radially outwards. The pair of branch fins 23 are preferably branched from the radially outer end of the main fin 22 in the circumferential direction, and extend radially outwards. The distance between the end of the branch fin 23 and the center axis J1 is a preferably predetermined fixed length LE in almost all of the fins 21. In detail, as shown in two-dot chain line in FIG. 2, in the case where a square 29 having a side which is slightly smaller than twice the predetermined length LE is supposed with the center axis J1 as the center, the end of the branch fin 23 positioned in the vicinity of the center of each side of the square 29 is located on the corresponding side. That is, the distance between the end of the branch fin 23 positioned in the vicinity of the center of each side of the square 29 and the center axis J1 is smaller than the predetermined length LE. The detailed description of the shape of the fins 21 which will be described later is directed to the fins 21 in which the distance between the end of the branch fin 23 and the center axis J1 is equal or substantially equal to the predetermined length LE. As for the radiating fin 21 of which the end is positioned in the vicinity of the center of each side of the square 29, in the case where it is assumed that the branch fin 23 is extended so as to be equal or substantially equal to the predetermined length LE, the following can be applied.

Figure 3:
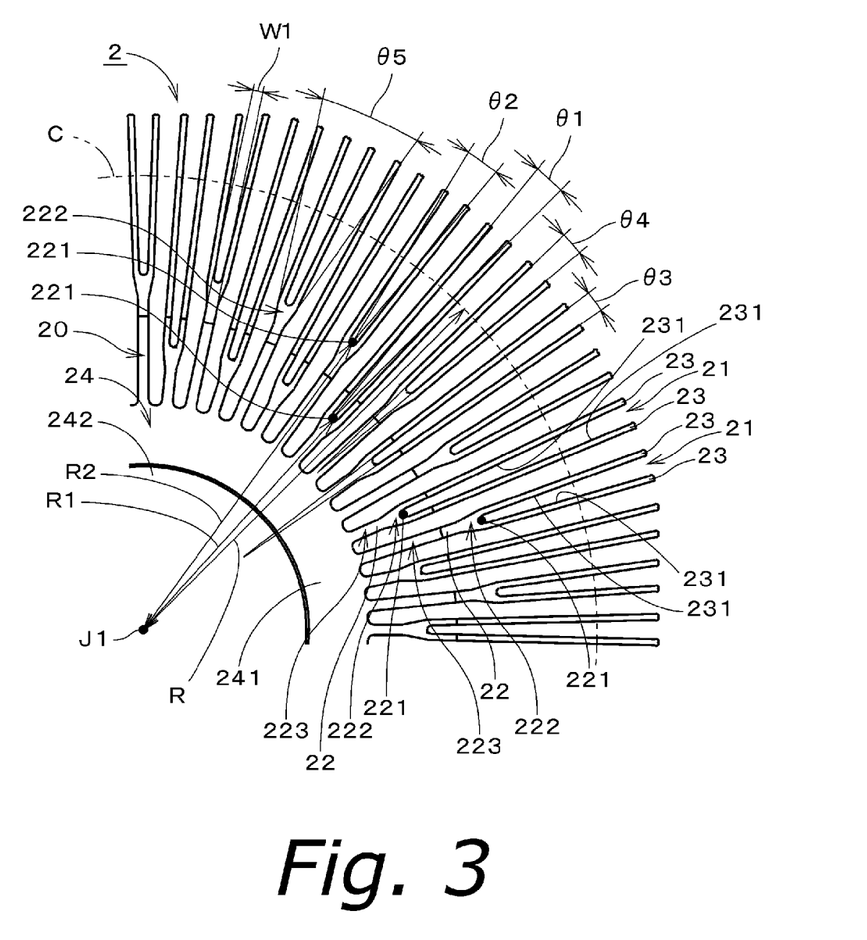
FIG. 3 is a view showing a portion of the heat sink according to a preferred embodiment of the present invention in an enlarged manner.

FIG. 3 is a view showing a portion of the heat sink 2 in an enlarged manner. The main fin 22 preferably extends straight along the radial direction from the cylindrical portion 241 of the core 24. In the main fin 22, a portion in the vicinity of the pair of branch fins 23 is an end portion 222. In the case where viewed along the center axis J1 as in FIG. 3, in the main fin 22, the width W1 from the root on the side of the core 24 to a portion 223 immediately in front of the end portion 222 is constant or substantially constant. That is, the corresponding portion 223 in the main fin 222 preferably has a fixed or substantially fixed thickness. Hereinafter the corresponding portion 223 in the main fin 22 is referred to as "a main fin body 223". In a portion in which the main fin 22 and the core 24 are connected, the corner portion is preferably rounded because of production, but the root of the main fin 22 is a portion of the main fin 22 which is the closest to the core 24 excluding the rounded corner portion.

In the main fin 22, the width of the end portion 222 is gradually expanded radially outwards. The angle θ5 at which the width of the end portion 222 is expanded radially outwards is constant in the radial direction. The angle θ5 at which the end portion 222 is expanded is the same or substantially the same in all of the fins 21. The end portion 222 is coupled to a pair of branch fins 23. Two surfaces 231 which are opposed to each other of the pair of branch fins 23 are defined by a continuous single surface. The position which is the closest to the end portion 222 in the single surface is a branch point 221. That is, the position which is most adjacent to the center axis J1 in the single surface is the branch point 221. Hereinafter the branch point 221 is regarded as an end of the main fin 22. The end of the main fin 22 is included in the end portion 222. The branch point 221 is a start point of the branch fin 23 in the radial direction. Two surfaces 231 which are opposed to each other of the pair of branch fins 23 are both referred to as "opposed surfaces 231".

Among the plurality of fins 21, in respective combination of two fins 21 which are adjacent to each other, the distance from the center axis J1 to the branch point 221 in one of the fins 21 is different from the distance from the center axis J1 to the branch point 221 in the other radiating fin 21. In more detail, the branch point 221 of the fins 21 in alternating ones of the plurality of fins 21 is preferably distant from the center axis J1 by a distance R1 while the branch point 221 of the remaining fins 21 is preferably distant from the center axis J1 by a distance R2 which is larger than the distance R1. In any of the combinations of three fins 21 which are adjacent in the circumferential direction, the distance from the center axis J1 to the branch point 221 in the center one of the three fins 21 is different from the distance from the center axis J1 to the branch point 221 in each of the other two fins 21. The difference between the distance R2 and the distance R1 is preferably equal to or more than the width W1 of the root of the main fin 22. In actuality, the distance preferably is sufficiently larger than the width W1 of the root.

In the following description, a radiating fin 21 in which the branch point 221 is arranged on the inner side, that is, a radiating fin 21 of which the branch point 221 is separated from the center axis J1 by the distance R1 is referred to as "an inner branch radiating fin 21". In addition, a radiating fin 21 in which the branch point 221 is disposed on the outer side, that is, the radiating fin 21 of which the branch point 221 is separated from the center axis J1 by the distance R2 is referred to as "an outer branch radiating fin 21". In the heat sink 2 shown in FIG. 3, the end portion 222 of the main fin 22 of the inner branch radiating fin 21 is preferably adjacent to the main fin body 223 of the outer branch radiating fin 21 in the circumferential direction. Due to the restrictions of design and production of the heat sink 2 or the like, some of the inner branch fins 21 or some of the outer branch fins 21 may adjacent to each other in the circumferential direction.

In each radiating fin 21, each of the pair of branch fins 23 extends straight or substantially straight from the end portion 222 of the main fin 22 along the radial direction. When viewed along the center axis J1, the width of each branch fin 23 is constant or substantially constant over the full length in the radial direction. In other words, the thickness of the branch fin 23 is preferably constant. The gap between the opposed faces 231 in the pair of branch fins 23, i.e. the gap between the pair of branch fins 23 is gradually increased radially outwards. The gap between the branch fins 23 in two fins 21 which are adjacent to each other is also gradually increased radially outwards.

Herein a circle C of an arbitrary radius R with the center axis J1 as the center is considered (depicted by two-dot chain line in FIG. 3). The radius R is larger than the distance R2 in the outer branch radiating fin 21 and equal to or less than the predetermined length LE. In this case, in the inner branch radiating fin 21, an angle θ1 defined by two line segments which connect the branch point 221 and two intersection points with the circle C in the two opposed surfaces 231 is referred to as an angle between line segments θ1. In the outer branch radiating fin 21, an angle θ2 defined by two line segments which connect the branch point 221 and two intersection points with the circle C in the two opposed surfaces 231 is referred to as an angle between line segments θ2. The above-mentioned line segments are perpendicular or substantially perpendicular to the center axis J1, and the case where the two intersection points are in the vicinity of the end portion 222 is excluded. In the heat sink 2 shown in FIG. 3, the two intersection points are positioned in an area which is parallel or substantially parallel in the radial direction and in the axial direction in the opposed surfaces 231. The angle between line segments θ1 in the inner branch radiating fin 21 is smaller than the angle between line segments θ2 in the outer branch radiating fin 21. As the radius R is increased, the angles between line segments θ1 and θ2 are gradually decreased.

In the pair of branch fins 23, an angle defined by two tangent lines in positions on the two opposed surfaces 231 which are separated on the outer side by an arbitrary distance along the branch fin 23 from the branch point 221 is defined as an expanding angle of the pair of branch fins 23. The two tangent lines are perpendicular or substantially perpendicular to the center axis J1, and the case where the points of contact of the two tangent lines with the opposed surface 231 are in the vicinity of the end portion 222 is excluded. In the heat sink 2 shown in FIG. 3, the points of contact are positioned in an area which is parallel or substantially parallel in the radial direction and in the axial direction in the opposed surfaces 231.

In the heat sink 2 shown in FIG. 3, the expanding angle θ3 in the inner branch radiating fin 21 is constant or substantially constant, and the expanding angle θ4 in the outer branch radiating fin 21 is also constant or substantially constant. The expanding angle θ4 in the outer branch radiating fin 21 is larger than the expanding angle θ3 in the inner branch radiating fin 21. Both of the expanding angle θ3 in the inner branch radiating fin 21 and the expanding angle θ4 in the outer branch radiating fin 21 are smaller than an angle θ5 at which the end portion 222 expands. In other words, in each radiating fin 21, the width of the end portion 222 of the main fin 22 expands radially outwards at the angle θ5 which is larger than the expanding angles θ3 and θ4 of the pair of branch fins 23. Accordingly, it is possible to prevent the width of the gap between the pair of branch fins 23 connected to the end portion 222 from being excessively narrowed. The maximum width in the end of the end portion 222 is preferably equal to or larger than three times the width of the branch fin 23, for example.

In order to increase the radiating efficiency of the heat sink, it is preferred that the surface area of the fins be increased in such a manner that the branch points are arranged on the inner side. Accordingly, a heat sink in which all of the fins include branch points arranged in the vicinity of the core and in which the distances from the center axis to the branch points are the same is considered as a comparative example. In the heat sink of the comparative example, the end portions of the main fins are adjacent in the circumferential direction. The width of the end portion expands at an angle larger than the expanding angle of the pair of branch fins. As a result, the width of the gap between the fins in the radial position of the end portion, i.e., the width of the gap between the end portions is excessively narrowed, which causes a problem in that the air flow from the fan is blocked in the gap. In the case where the heat sink of the comparative example is fabricated by, for example, extrusion molding or pultrusion molding by using a die, the width of a portion of the die used in forming the gap between the fins, i.e., the thickness of the portion of the die is excessively small. As a result, there also arises a problem that the strength of the portion of the die is lowered, and the durability of the die is lowered. In the case where the width of the end portion of the main fin is caused to expand at an angle equal to the expanding angle of the pair of branch fins, the width of the gap between the pair of branch fins is excessively narrowed by arranging the branch points on the inner side. In this case, similarly, there arises a problem in that the air flow from the fan is blocked, and a problem in that the durability of the heat sink fabricating die is lowered.

On the contrary, in the heat sink 2 shown in FIG. 3, in any combinations of the three fins 21 which are adjacent in the circumferential direction, the distance from the center axis J1 to the branch point 221 is preferably different between the center radiating fin 21 and the other two fins 21. Accordingly, the end portions 222 of which the widths are drastically increased are prevented from being adjacent in the circumferential direction and the width of the gap between the fins 21 is prevented from being excessively narrowed. As a result, the problem that the air flow from the fan is blocked can be avoided, and the surface area of the fins 21 can be increased, so that the radiating efficiency of the heat sink 2 can be increased. In addition, the reduction of durability of the heat sink fabricating die can be prevented.

In an arbitrary radius R, the angle between line segments $\theta 1$ in the inner branch radiating fin 21 is smaller than the angle between line segments $\theta 2$ in the outer branch radiating fin 21. Accordingly, the angle at which the pair of branch fins 23 of the inner branch radiating fin 21 expand is restricted. Accordingly, between the branch point 221 and the outer edge portion, it is possible to easily realize a design that prevents the width of the gap between the fins 21 from being excessively narrowed.

In the plurality of fins 21 of the heat sink 2, a portion on the inner side from the predetermined radius with the center axis J1 as the center protrudes downwards. That is, as shown in FIG. 1, the heat sink 2 includes a protruding portion 20 which protrudes downwards. The branch point 221 of the inner branch radiating fin shown in FIG. 3 is positioned on the inner side from the predetermined radius. Accordingly, a portion of the branch fin 23 in the inner branch radiating fin 21 is included in the protruding portion 20. As described above, by increasing the surface area in the protruding portion 20 arranged in the immediate vicinity of a heat source such as, for example, a CPU, the radiating efficiency of the heat sink 2 can be further enhanced. In the condition where the heat sink fan 1 is mounted on a mother board, the heat sink 2 does not exist around the protruding portion 20 which is in contact with the CPU, so that the interference with various electronic components on the mother board can be prevented.

Figure 4:
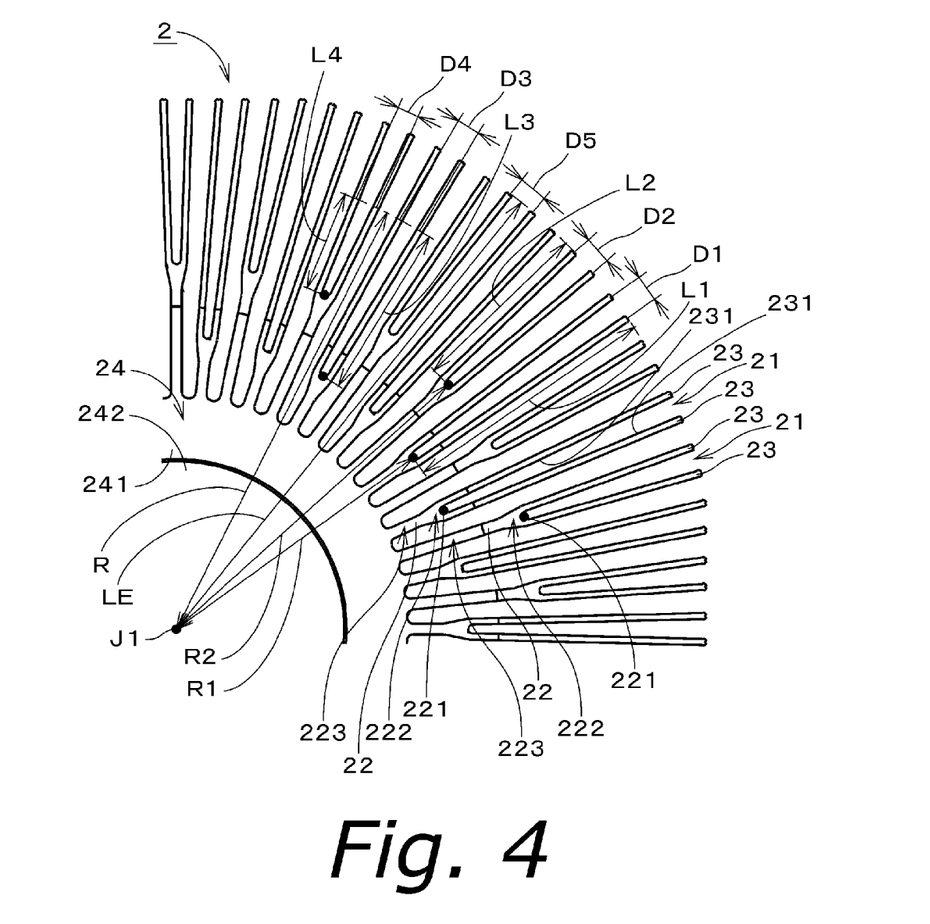
FIG. 4 is a view showing a portion of the heat sink according to a preferred embodiment of the present invention in an enlarged manner.

As shown in FIG. 4, in the inner branch radiating fin 21 in which the branch point 221 is preferably separated from the center axis J1 by the distance R1, a value obtained by dividing the distance D1 between the ends of the pair of branch fins 23 by the length L1 of the branch fin is represented by $\alpha 1$. In addition, in the outer branch radiating fin 21 in which the branch point 221 is separated from the center axis J1 by the distance R2, a value obtained by dividing the distance D2 between the ends of the pair of branch fins 23 by the length L2 of the branch fin is represented by $\alpha 2$. The values $\alpha 1$ and $\alpha 2$ are index values indicating the degrees of expansion of the pair of branch fins 23 in the case where the ends of the branch fins 23 are focused on. In the heat sink 2, the value $\alpha 1$ in the inner branch radiating fin 21 is smaller than the value $\alpha 2$ in the outer branch radiating fin 21. In other words, by utilizing the predetermined length LE which is the distance between the end of the branch fin 23 and the center axis J1, the condition of $((D1/(LE-R1))<(D2/(LE-R2)))$ is satisfied. As described above, the expansion of the pair of branch fins 23 in the inner branch radiating fin 21 is smaller than that in the outer branch radiating fin 21. Accordingly, in the outer edge portion of the heat sink 2, it is possible to easily realize a design which prevents the width of the gap between the fins 21 from being excessively narrowed.

In the inner branch radiating fin 21, a value obtained by dividing the distance D3 between the pair of branch fins 23 in the position of the arbitrary radius R with the center axis J1 as the center by the length L3 from the branch point 221 to the position of the arbitrary radius R along the radial direction of the branch fin 23 is represented by $\alpha 3$. Herein the length L3 is the difference between the distance R1 between the center axis J1 and the branch point 221 in the inner branch radiating fin 21 and the radius R. The same can be said for the length L4 which will be described below. In addition, in the outer branch radiating fin 21, a value obtained by dividing the distance D4 between the pair of branch fins 23 in the position of the arbitrary radius R by the length L4 from the branch point 221 to the position of the radius R is represented by $\alpha 4$. The values $\alpha 3$ and $\alpha 4$ are both index values indicating the degree of expansion of the pair of branch fins 23 in the respective radial position from the branch point 221 to the end of the branch fin 23. In the heat sink 2, the value $\alpha 3$ in the inner branch radiating fin 21 is smaller than the value $\alpha 4$ in the outer branch radiating fin 21. That is, the condition of $((D3/(R-R1))<(D4/(R-R2)))$ is satisfied. Accordingly, from the branch point 221 to the outer edge portion, it is possible to easily realize a design that prevents the width of the gap between the fins 21 from being excessively narrowed.

In the heat sink 2, the distance D2 between the ends of the pair of branch fins 23 in the inner branch radiating fin 21 is preferably equal or substantially equal to the distance D2 between the end portions of the pair of branch fins 23 in the outer branch radiating fin 21. Accordingly, uniform radiation in the circumferential direction can be realized. Preferably, between two fins 21 which are adjacent to each other, the distance D5 between the ends of the branch fins 23 is equal to the distances D1 and D2 of the inner branch radiating fin 21 and the outer branch radiating fin 21, or slightly larger than the distances D1 and D2. Accordingly, in the heat sink fabricating die, it is possible to increase the width of the root of the long portion positioned between the fins 21. As a result, a certain durability of the heat sink fabricating die can be ensured.

Figure 5:
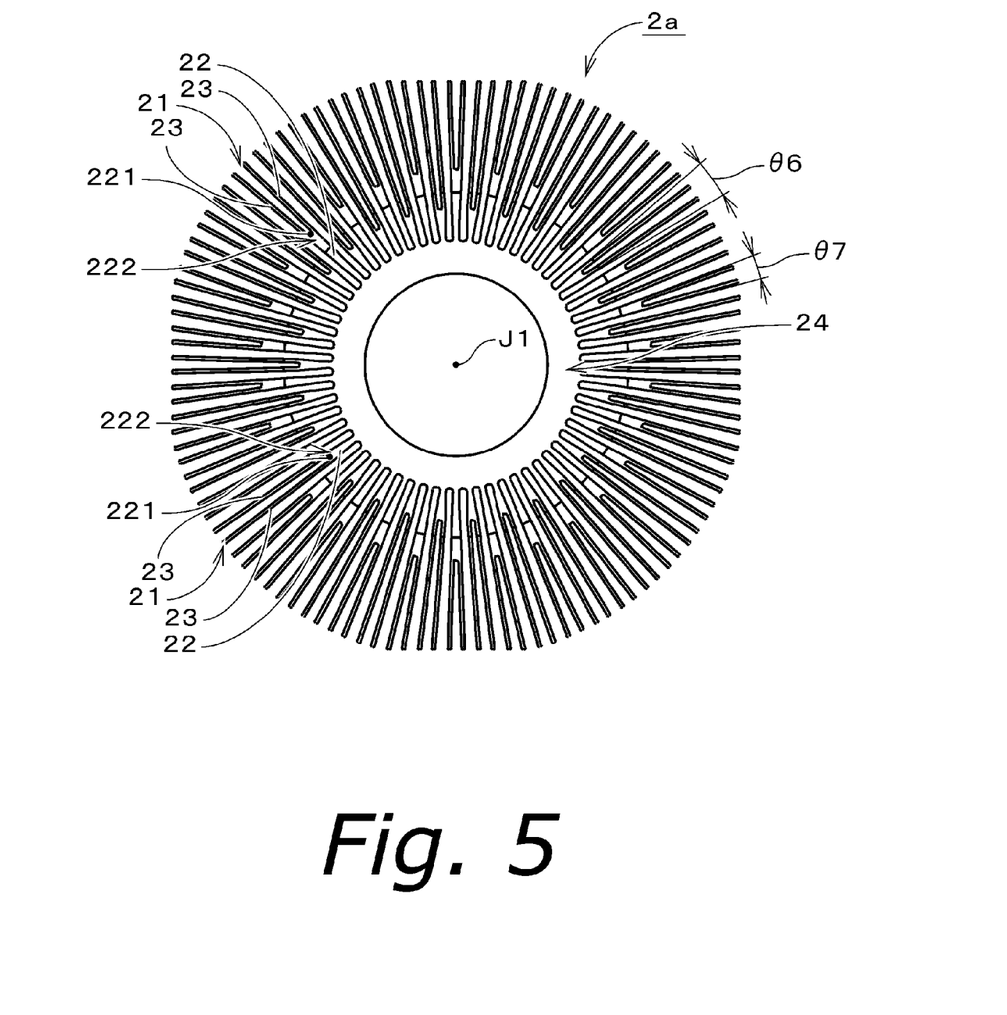
FIG. 5 is a bottom view showing another example of a preferred embodiment of the heat sink according to the present invention.

FIG. 5 is a bottom view showing a heat sink 2a according to another preferred embodiment of the present invention. In the heat sink 2a shown in FIG. 5, the shape of the main fin 22 is different from that of the heat sink 2 shown in FIG. 2. The other configurations are preferably the same or substantially the same as those in FIG. 2, so that they are designated by the same reference numerals.

In the heat sink 2a shown in FIG. 5, the width of the main fin 22 as a whole expands at a certain angle from the root on the side of the core 24 to the branch point 221. Specifically, in the plurality of inner branch fins 21, the width of the main fin 22 expands radially outwards at a certain angle $\theta 6$. In the plurality of outer branch fins 21, the width of the main fin 22 expands radially outwards at a certain angle $\theta 7$ which is different from the angle $\theta 6$. The angle $\theta 7$ is smaller than the angle $\theta 6$.

In the inner branch radiating fin 21, the expanding angle of the pair of branch fins 23 is smaller than the angle $\theta 6$ at which the main fin 22 expands. In other words, in the main fin 22, the entire width including the end portion 222 expands radially outwards at the angle $\theta 6$ which is larger than the expanding angle of the pair of branch fins 23. Also in the main fin 22 of the outer branch radiating fin 21, the entire width including the end portion 222 expands radially outwards at the angle $\theta 7$ which is slightly larger than the expanding angle of the pair of branch fins 23. Accordingly, the width of the gap between the pair of branch fins 23 in the respective fins 21 can be prevented from being excessively narrowed.

In any combination of three fins 21 which are adjacent in the circumferential direction, the distances from the center axis J1 to the respective branch points 221 are different between the center one of the three fins 21 and the other two fins 21. Accordingly, it is possible to prevent the width of the gap between the fins 21 from being excessively narrowed. As a result, the problem that the air flow from the fan is blocked can be avoided, and the surface area of the fins 21 can be increased so as to enhance the radiating efficiency of the heat sink 2a. In addition, it is possible to prevent the durability of the heat sink fabricating die from being lowered.

Figure 6:
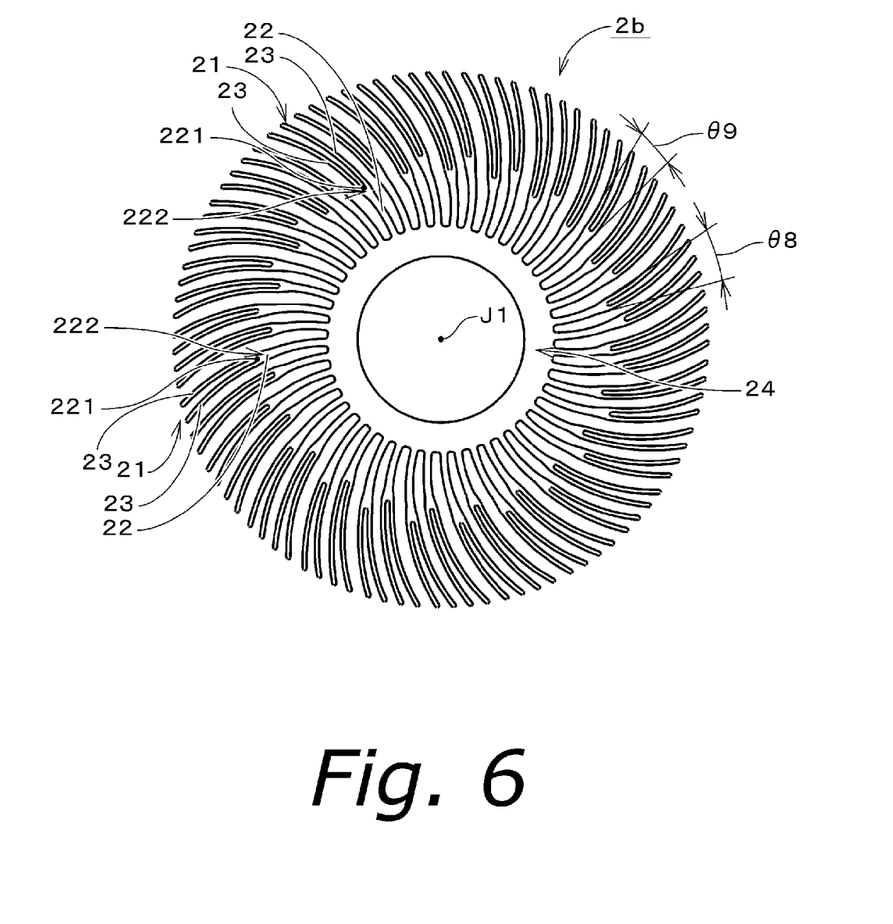
FIG. 6 is a bottom view showing still another example of a preferred embodiment of the heat sink according to the present invention.

FIG. 6 is a bottom view showing a heat sink 2b according to still another preferred embodiment of the present invention. In the heat sink 2 shown in FIG. 2, the plurality of fins 21 extend radially outwards in a straight manner. On the contrary, in the heat sink 2b shown in FIG. 6, the plurality of fins 21 extend in a curved manner. In the plurality of inner branch fins 21, the width of the end portion 222 of the main fin 22 expands radially outwards at a certain angle θ8. In the plurality of outer branch fins 21, the width of the end portion 222 of the main fin 22 expands radially outwards at a certain angle θ9 which is different from the angle θ8. The angle θ9 is smaller than the angle θ8.

In the inner branch radiating fin 21, the expanding angle of the pair of branch fins 23 is smaller than the angle θ8 at which the main fin 22 expands. In other words, in the main fin 22 of the inner branch radiating fin 21, the width of the end portion 222 expands radially outwards at the angle θ8 which is larger than the expanding angle of the pair of branch fins 23. Also in the main fin 22 of the outer branch radiating fin 21, the width of the end portion 222 expands radially outwards at the angle θ9 which is larger than the expanding angle of the pair of branch fins 23. Accordingly, it is possible to prevent the width of the gap between the pair of branch fins 23 in the respective radiating in 21 from being excessively narrowed.

In any combination of three fins 21 which are adjacent in the circumferential direction, the distances from the center axis J1 to the respective branch points 221 are different between the center one of the three fins 21 and the other two fins 21. Accordingly, it is possible to prevent the width of the gap between the fins 21 from being excessively narrowed. As a result, the problem that the air flow from the fan is blocked can be avoided, and the surface area of the fins 21 can be increased so as to enhance the radiating efficiency of the heat sink 2b. In addition, it is possible to prevent the durability of the heat sink fabricating die from being lowered. It should be noted that in the heat sink 2b shown in FIG. 6, a protruding portion is preferably not provided. Alternatively, such a protruding portion (similar to the protruding portion 20 discussed in the above preferred embodiments of the present invention) may be provided in the heat sink 2b if so desired.

The preferred embodiments of the present invention are described above, but the present invention is not limited to the preferred embodiments described above, but can be variously modified.

In the heat sinks 2, 2a, and 2b, in only one combination of three fins 21 which are adjacent in the circumferential direction among the plurality of fins 21, the width of the end portion 222 may preferably expand radially outwards at an angle which is larger than the expanding angle of the pair of branch fins 23. That is, in the heat sinks 2, 2a, and 2b, at least one combination of such three fins 21 is preferably included. Also in this case, it is preferable that, among the corresponding three fins 21, the distance from the center axis J1 to the branch point 221 in the center one of the fins 21 is different from the distance from the center axis J1 to the branch point 221 in each of the other two fins 21. Accordingly, it is possible to prevent the width of the gap between the branch fins 23 in the radiating fin 21 and the width of the gap between the fins 21 from being excessively narrowed, and the radiating efficiency of the heat sinks 2, 2a, and 2b can be increased.

At this time, it is sufficient that the difference between the distance from the center axis J1 to the branch point 221 in the center radiating fin 21 and the distance from the center axis J1 to the branch point 221 in each of the other two fins 21 preferably be equal to or larger than the width of the root of the main fin 22 in the center radiating fin 21. Preferably, the above-mentioned difference may be equal to or larger than twice the width of the root, and more preferably, equal to or larger than four times the width of the root, for example. From the point of view of increasing the surface area in the three fins 21, the above-mentioned difference may preferably be equal to or less than the half of the full length of the radiating fin 21 in the radial direction, for example. Preferably, the distance between the ends of the branch fins 23 in the center radiating fin 21 and each of the other two fins 21 may be larger than the distance between the ends of the pair of branch fins 23 in each of the fins 21. Accordingly, in the heat sink fabricating die, the width of the root in a long portion positioned between the fins 21 can be increased. The distances from the center axis J1 to the respective branch points 221 in the corresponding three fins 21 may be different from each other. That is, there may be three or more types of distances from the center axis J1 to the branch point 221.

Next, among the corresponding three fins 21, when the radiating fin 21 of which the branch point 221 is positioned on the innermost side is referred to as an innermost branch radiating fin 21, the relationship between the innermost branch radiating fin 21 and the radiating fin 21 which is adjacent to the innermost branch radiating fin 21 will be described. The relationship between the innermost branch radiating fin 21 and the radiating fin 21 which is adjacent to the innermost branch radiating fin 21 is preferably the same as the relationship between the inner branch radiating fin 21 and the outer branch radiating fin 21 in the above-described preferred embodiments. That is, preferably, a value obtained by dividing the distance between ends of the pair of branch fins 23 by the length of the branch fin 23 in the innermost branch radiating fin 21 is smaller than a value obtained in the same way in the radiating fin 21 which is adjacent to the innermost branch radiating fin 21 among the corresponding three fins 21. More preferably, a value obtained by dividing the distance between the pair of branch fins 23 in an arbitrary radial position by the length of the branch fin 23 from the branch point 221 to the radial position in the innermost branch radiating fin 21 is smaller than a value obtained in the same way in the above-mentioned adjacent radiating fin 21.

In the innermost radiating fin 21, an angle defined by two line segments which connect the branch point 221 and two intersection points with a circle having an arbitrary radius with the center axis J1 as its center in two surfaces of the pair of branch fins 23 which are opposed to each other are referred to as an angle between line segments. In this case, the angle between line segments in the innermost branch radiating fin 21 is preferably smaller than the angle between line segments in the radiating fin 21 which is adjacent to the innermost branch radiating fin 21. With such a configuration, it is preferably possible to easily prevent the width of the gap between the fins 21 from being excessively narrowed.

Moreover, in the case where the branch point 221 of the innermost branch radiating fin 21 is positioned on the inner side than the radius of the protruding portion 20, the radiating efficiency of the heat sink 2 can be further enhanced.

The heat sink may be produced in such a manner that, while the billet is extruded from the heat sink fabricating die, the material extruded from the heat sink fabricating die is twisted with the center axis of the heat sink fabricating die as the center. In such a heat sink, respective thin-plate fins expand in the radial direction and the up/down directions, and are tilted with respect to the axial direction.

If the width of the end portion 222 of the main fin 22 expands radially outwards at an angle larger than the expanding angle of the branch fin 23, the angle at which the end portion 222 expands may be gradually varied along the radial direction. Depending on the design of the heat sinks 2, 2a, and 2b, the width of the branch fin 23 may vary along the radial direction. The heat sink may be made from any material other than the aluminum alloy, the copper alloy, and the like.

The configurations in the above-mentioned preferred embodiments and respective modifications thereof may be appropriately combined unless they are mutually exclusive.

Preferred embodiments of the present invention and modifications thereof can be applied to various heat sink fans utilizing heat sinks. In addition, preferred embodiments of the present invention and modifications thereof can be applied to heat sinks for applications other than the heat sink fans.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A heat sink comprising:
    a plurality of fins arranged radially about a center axis and spaced away from one another, the plurality of fins extending outward in a radial direction perpendicular or substantially perpendicular to the center axis; and
    a core arranged to couple and to support inner sides of the plurality of fins; wherein
    each of the plurality of fins includes:
        a main fin connected to the core and extending radially outwards; and
        a pair of branch fins which are branched in a circumferential direction from a branch point as a radially outer end of the main fin, and which extend radially outwards;
    among the plurality of fins, in each of three fins which are adjacent in the circumferential direction, a width of an end portion including the end of the main fin viewed along the center axis expands radially outwards at an angle which is larger than an expanding angle of the pair of branch fins;
    among the three fins, a difference between a distance from the center axis to the branch point in the center one of the fins and a distance from the center axis to the branch point in each of the other two fins is equal to or larger than a width of a root of the main fin in the center one of the fins; and
    in an innermost branch radiating fin of which the branch point is positioned on an innermost side among the three fins, a value obtained by dividing a distance between ends of the air of branch fins by a length of the branch fin is smaller than a value obtained in the same way in a radiating fin which is adjacent to the innermost branch radiating fin anon the three fins.

2. A heat sink according to claim 1, wherein in the innermost branch radiating fin, a value obtained by dividing a distance between the pair of branch fins in an arbitrary radial position with the center axis as the center by a length of the branch fin along the radial direction from the branch point to the arbitrary radial position is smaller than a value obtained in the same way in the radiating fin which is adjacent to the innermost branch radiating fin among the three fins.

3. A heat sink according to claim 1, wherein in an innermost branch radiating fin of which the branch point is positioned on the innermost side among the three fins, an angle defined by two line segments which connect the branch point and two intersection points with a circle having an arbitrary radius with the center axis as the center in two surfaces of the pair of branch fins which are opposed to each other is smaller than an angle obtained in the same way in a radiating fin which is adjacent to the innermost branch radiating fin among the three fins.

4. A heat sink according to claim 1, wherein
    in each of the plurality of fins, a width of the end of the main fin viewed along the center axis expands radially outwards at an angle larger than an expanding angle of the pair of branch fins; and
    among the plurality of fins, in each combination of two fins which are adjacent to each other, a difference between a distance from the center axis to the branch point in one of the fins and a distance from the center axis to the branch point in another one of the fins is equal to or larger than the width of the root of the main fin in the one of the fins.

5. A heat sink according to claim 1, wherein a distance between ends of branch fins in the center one of the fins and each of the other two fins is larger than a distance between ends of the pair of branch fins in each of the three fins.

6. A heat sink according to claim 1, wherein
    in the plurality of fins, a region on the inner side from a predetermined radius with the center axis as the center protrudes downwards; and
    the branch point of an innermost branch radiating fin of which the branch point is positioned on the innermost side of the three fins is positioned farther on the inner side than the predetermined radius.

7. A heat sink according to claim 1, wherein a width of each branch fin viewed along the center axis is constant or substantially constant over a full length in the radial direction.

8. A heat sink according to claim 1, wherein the plurality of fins extend radially outwards in a straight manner.

9. A heat sink according to claim 1, wherein a center portion of the core contains a copper alloy, and an outer edge portion of the core and the plurality of fins contain an aluminum alloy.

10. A heat sink according to claim 1, wherein the heat sink is produced by extrusion molding or pultrusion molding which utilizes a dividing die and a heat sink fabricating die.

11. A heat sink fan, comprising:
    a heat sink of claim 1; and
    a fan arranged to send an air to the heat sink.

* * * * *